United States Patent [19]
Anderson

[11] Patent Number: 5,300,447
[45] Date of Patent: Apr. 5, 1994

[54] METHOD OF MANUFACTURING A MINIMUM SCALED TRANSISTOR

[75] Inventor: Dirk N. Anderson, Plano, Tex.

[73] Assignee: Texas Instruments Incorporated, Dallas, Tex.

[21] Appl. No.: 953,632

[22] Filed: Sep. 29, 1992

[51] Int. Cl.[5] .......................................... H01L 21/336
[52] U.S. Cl. ........................................ 437/41; 437/40; 437/203; 437/984
[58] Field of Search ................... 437/203, 40, 41, 984; 257/330, 332

[56] References Cited

U.S. PATENT DOCUMENTS

| | | | |
|---|---|---|---|
| 4,763,177 | 8/1988 | Paterson | 357/23.5 |
| 4,803,176 | 2/1989 | Bower | 437/33 |
| 4,978,629 | 12/1990 | Komori et al. | 437/41 |
| 5,010,025 | 4/1991 | Solomon | 437/29 |

FOREIGN PATENT DOCUMENTS

| | | | |
|---|---|---|---|
| 54-102980 | 8/1979 | Japan | 257/332 |
| 62-136877 | 6/1987 | Japan | 257/332 |
| 2-105576 | 4/1990 | Japan | 257/330 |
| 3-6060 | 1/1991 | Japan | 257/330 |

OTHER PUBLICATIONS

Wolf, S., et al., Silicon Processing, vol. I, Lattice Press, 1986, pp. 243-262.

*Primary Examiner*—T. N. Quach
*Attorney, Agent, or Firm*—Robby T. Holland; James C. Kesterson; Richard Donaldson

[57] ABSTRACT

An extremely small minimum scaled Metal-Oxide-Semiconductor, MOS, transistor is manufactured by forming a trench in a semiconductor substrate, forming a gate in the trench, and then forming source and drain regions. The source and drain regions may be diffused into the semiconductor substrate and annealed to drive the diffusions around the trench corners, thus forming the transistor channel. This improves punchthrough resistance of the transistor while yielding an extremely small gate channel. The diffusion concentration will be larger near the surface of the semiconductor substrate and smaller near the plane of the gate channel underneath the trench bottom. The trench corners have the effect of serving as a line source of dopant for diffusion under the trench such that the doping profile is the same along a radius of a cylindrical junction, thus keeping the minimum diffusion separation at the channel surface.

8 Claims, 1 Drawing Sheet

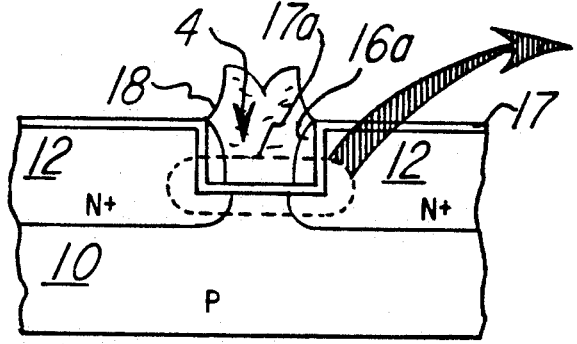
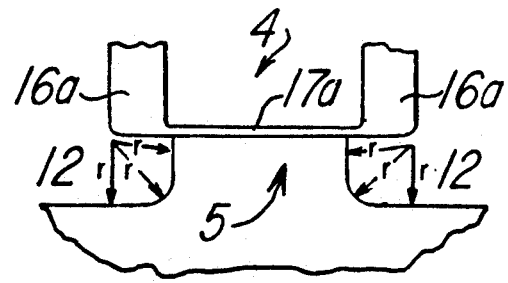
Fig.1a
Fig.1b
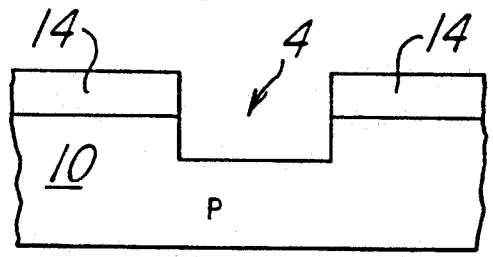
Fig.2
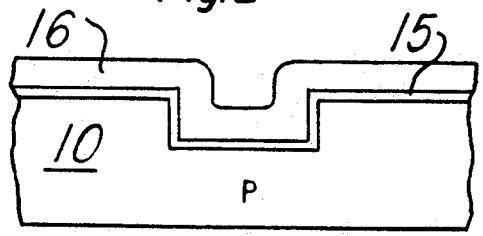
Fig.3
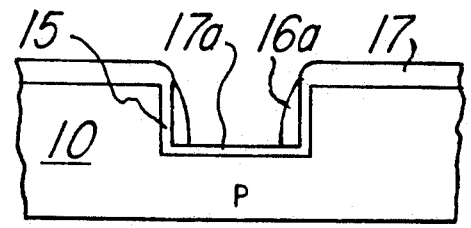
Fig.4
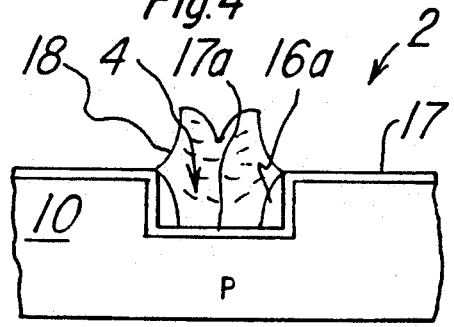
Fig.5
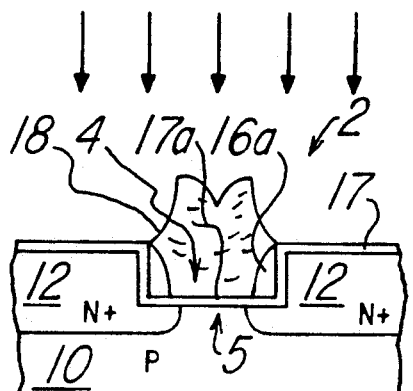
Fig.6

METHOD OF MANUFACTURING A MINIMUM SCALED TRANSISTOR

CROSS REFERENCE TO RELATED APPLICATIONS

This application is related to simultaneously cofiled and coassigned U.S. patent application Ser. No. 07/953,398, TI-14936, entitled "A Minimum Scaled Transistor and Method of Manufacture".

FIELD OF THE INVENTION

This invention relates to semiconductor devices and methods in manufacture and more particularly to methods of making Metal-Oxide-Semiconductor, MOS, semiconductor transistors.

BACKGROUND OF THE INVENTION

Semiconductor devices are widely used throughout the electronics industry. One factor driving their use is the ability to put more and more circuits on a silicon chip. For example, semiconductor memory manufacturers have steadily progressed from memories of the 16K type as shown in U.S. Pat. No. 4,081,701 issued to White, McAdams and Redwine, to memories of the 1M type, as described in U.S. Pat. No. 4,658,377 issued to McElroy. Memories of the 4M type are now being produced, production plans for high density 16M memories having submicron technology now exist, and experimentation of 64M memories has begun. Other VLSI devices such as microprocessors are now produced that have more than one million transistors on chip.

In order to put more and more circuits on a silicon chip, without unduly increasing the size of the semiconductor chip, it is necessary to reduce the size of the individual semiconductor devices formed on the semiconductor chip. U.S. Pat. No. 4,240,092 to Kuo and U.S. Pat. No. 4,721,987 to Baglee et al, discuss scaling down the size of memory devices. U.S. Pat. No. 4,356,623 to Hunter, incorporated herein by reference, discusses scaling down the size of semiconductor transistors. Some encountered problems include parasitic capacitances, resistances, and punchthrough currents. Hunter's solution provides a Metal-Oxide-Semiconductor, MOS, transistor with a gate conductor within the range of about 0.1 microns to about 1 micron. A gate insulator is formed on top of a substrate and a gate conductor is formed on top of the gate insulator. The gate conductor has sidewall insulators. Ion implantation and subsequent drive-in anneal form the source/drain regions of the transistor. The source/drain regions extend underneath the sidewall insulators and underneath gate of the transistor.

Additional scaling of semiconductor devices is needed. By forming larger numbers of semiconductor devices in a semiconductor chip, the cost per device is greatly reduced. By increasing the density of semiconductor elements on a chip, the manufacturing costs can be decreased. This will allow further use and application of semiconductor devices throughout the electronics industry and benefit consumers.

The channel length scaling in MOS transistors is limited by the punchthrough voltage, i.e., the source to drain bias that produces current between the source and drain when the gate to source bias is at the "off" condition. The implanted source/drain regions to the typical planar self-aligned MOS transistor cannot be guaranteed to have a vertical doping profile before diffusion such that the highest doping concentration is at the silicon surface. Thus later diffusion, proportional to the concentration gradients, may be greater at some depth below the surface that is not adequately controlled by the gate. Very shallow voltage threshold, $V_t$, implants which counterdope the surface can contribute to this effect which results in sub-surface conduction at a source to drain voltage lower than that needed to produce current in the gate controlled surface channel at "off" bias.

It is an object of this invention to provide a method of manufacturing such small semiconductor device.

It is an additional object of this invention to arrange the surface channel and the source/drain diffusions such as to prevent the possibility of higher dopant concentrations in the substrate below the plane of the gate controlled channel, thereby preventing the sub-surface punchthrough and resulting lowering of the device punchthrough voltage.

Other objects and advantages will be apparent to those of ordinary skill in the art having reference to the following specification and drawings.

SUMMARY OF THE INVENTION

A process for fabricating a minimum scaled MOS transistor forms a transistor having its channel below a trench recess. According to the inventive process, the recess is formed in surface of the semiconductor substrate. Sidewall insulators and thin gate dielectric are formed in the recess. A gate conductor is placed in the recess. An implant occurs which places source/drain dopant into the semiconductor material on either side of the recess. The channel is formed under the recess by an anneal step which drives the dopant into the semiconductor substrate and around the recess corners. The trench corners have the effect of serving as a line source of dopant for diffusion under the trench such that the doping profile is about the same along a radius, thus keeping minimum diffusion separation at the channel surface. This forms an extremely small transistor having self aligned source and drain regions and having reduced punchthrough sensitivity.

BRIEF DESCRIPTION OF THE DRAWINGS

FIG. 1a is an enlarged sectional view illustrating a semiconductor device manufactured in accordance with the inventive process.

FIG. 1b is an enlarged view of the channel area of the semiconductor device of FIG. 1a.

FIGS. 2, 3, 4, 5 and 6 are enlarged sectional views illustrating successive stages in manufacturing the device of FIG. 1a according to the preferred embodiment of the invention.

DETAILED DESCRIPTION OF THE PREFERRED EMBODIMENT

FIG. 1a illustrates an enlarged sectional view of a semiconductor device 2 made in accordance with the preferred embodiment of the invention. The semiconductor device 2 is referred to as a recessed channel transistor Metal-Oxide-Semiconductor, MOS, device having a trench, or groove, 4 formed and recessed into an active face of a substrate 10 of semiconductor material. The semiconductor substrate 10 illustrated is of the P type and thus the transistor 2 is an N channel device. As will be explained later, the trench 4 may be etched into the face of semiconductor material by conventional techniques and thus photolithography considerations will help determine the transistor channel length 5. This means that the length of channel 5 can be extremely small and might be on the order of about a quarter of a micron, for example. The gate conductor 18 of transistor 2 lies within the trench 4 over the channel 5. Transistor 2 is a very small planar device.

In FIG. 1a, on each side of trench 4 lie doped regions 12. Doped regions 12 comprise the source and drain of transistor 2. They are part of the substrate 10 and are doped N+ in this example. Trench 4 separates doped source/drain regions 12. The bottom of the N+ source/drain regions 12 next to channel 5 extend below the trench 4 on either side. Doped region 12 might be on the order of about two tenths of a micron.

In FIG. 1a, an insulator 16a resides on the trench walls in the trench 4. Exemplary insulators include oxide and nitride. Insulator 16a forms sidewall insulators and isolates the doped source/drain regions 12 from the conductor 18. Insulator 16a may be on the order of a few hundred angstroms thick. Insulator 17a covers the bottom of the groove. It forms a gate insulator for recessed channel transistor 2 by separating substrate 10 from conductor 18. Oxide conductance and the maximum voltage applied to gate conductor 18 help determine the thickness of insulator 17a. In general, insulator 17a is preferably as thin as possible. For low voltage applications, such as in a lap top computer, for example, where the voltage supplied by a battery may be on the order of about 2 volts, the gate oxide 17a might be on the order of about 50 angstroms.

Still referring to FIG. 1a, conductor 18 fills the trench 4. It covers insulator portion 16a on the trench walls and covers insulator portion 17a on the bottom of the trench. Conductor 18 forms the gate of transistor 2. Conductor 18 is formed of polysilicon in this example. The gate conductor can be patterned by masking and etching it to the desired width. Preferably, it should not significantly extend over the trench edge and should terminate approximately at about the trench edge. Alternatively, the gate conductor could be etched back, unmasked, until flush with the top trench corners.

In FIG. 1a and the enlarged view of FIG. 1b, doped regions 12 preferably extend slightly around the corners of trench 4, about the width of sidewall insulator 16a. This avoids potential reliability problems associated with the trench 4 corner being in the channel and ensures conduction between the source and drain when the appropriate potential is applied to the gate 18. The trench corner has the effect of serving as a line source of dopant for diffusion under the trench 4 and the doping profile is the same along any radius, r, of the cylindrical junction as shown in FIG. 1b; thus the minimum diffusion separation is kept at the channel surface. The diffusion should be optimized for best device performance in lateral diffusion along the base of the trench 4 under the sidewall insulator 16a. The diffusion will extend below the bottom surface of the trench by the optimized lateral diffusion distance on either side of the trench. By extending the dopant around the corners of the trench, current drive characteristics of transistor are improved. By recessing the gate transistor channel between the source/drain regions, punchthrough characteristics are improved.

FIGS. 2-6 illustrate successive stages in the preferred embodiment of the manufacturing process used to form semiconductor device of FIG. 1a. This inventive process creates the trench before forming the source/drain regions.

FIG. 2, reveals the resulting structure following the formation of trench 4 in the face of semiconductor material 10. A trench mask step forms the trench mask 14 over the semiconductor substrate 10. The trench may be patterned by coating, exposing, and developing a photoresist. The trench can have an extremely small width which may be governed by the limitations of the lithographic technique used. At present, photolithography may be easily utilized. An etch step through the trench mask oxide and into the face of semiconductor 10 creates the trench 4 to the desired depth. An anisotropic dry etch such as a RIE $SiF_4$/HBr etch step is suitable to open the trench. Although not illustrated in FIG. 2, it may be desirable to perform a voltage threshold, Vt, step to adjust the threshold voltage of the transistor. An ion implant with or without a thin screen oxide will accomplish this. In a 5 volt device, typical voltage thresholds are on the order of approximately 1 volt. In a 1.5 volt device, voltage thresholds are smaller and may, for example, be on the order of about 0.4 volts.

FIG. 3 illustrates the resulting structure following the formation of an oxide layer 15 and an overlying nitride layer 16. Thermal oxidation grows gate oxide 15 in the channel recess 4 and over the face of wafer 10. Either wet steam oxidation or dry oxidation will work to form the oxide layer 15. The oxide layer 15 is a dummy gate layer and helps cure any damage to substrate 10 at the bottom of the trench caused by the trench etch step. A nitride deposition step forms nitride layer 16 in recess 4 over dummy gate oxide 15 and over the face of wafer 10.

FIG. 4 reveals the resulting structure following formation of sidewalls 16a and insulator 17. An anisotropic nitride etch step removes the nitride layer 16 from the face of wafer 10 and from the bottom of trench 4. The dummy gate oxide 15 stops the nitride etch step from etching through the trench bottom into the substrate 10. The nitride etch step leaves sidewalls of nitride 16a on the trench walls. A deglaze step then removes the dummy gate oxide layer 15 from the trench bottom. A layer of dummy gate oxide 15 remains underneath the nitride sidewalls 16a. Gate oxide layer 17 may then be formed by thermal oxidation. This creates the gate oxide layer 17a in the trench bottom. The gate oxide layer 17 is also formed over the semiconductor wafer.

FIG. 5 shows the resulting structure following the formation of the gate conductor 18. Polysilicon is an exemplary conductor and it may be deposited to form gate conductor 18. In situ doped polysilicon will work well. The gate conductor 18 may be shaped by using an isotropic polysilicon etch. The etch will align the gate 18 in the same direction as the trench 4. The edges of the gate 18 should not significantly lie over the edge of the trench.

FIG. 6 shows the resulting structure following the formation of the source/drain regions 12. These regions may be created by an ion implant step through the oxide layer 17 overlying the semiconductor 10 surface and a subsequent anneal drive. The source/drain implant energies and the anneal are determined by the desire to get a low dopant concentration level of the diffusion around the channel corner edges. The anneal time should be such to drive the dopant under the sidewall insulators to give the transistor very low punchthrough characteristics. Again, the dopant diffusion around the trench corners helps define the channel length. The dopant diffusion should extend underneath the trench to about the width of the sidewall insulators 16a. The source and drain are thus self aligned to the transistor gate by the anneal step. Arsenic or phosphorus may be diffused into the P type semiconductor substrate 10 to form the N+source/drain diffusions. The gate conductor 18 blocks the ion implant step from doping the substrate 10 at the trench bottom.

In further unillustrated processing steps, contacts will be made through the oxide insulator 17 to the source/drain regions to facilitate access to the MOS transistor.

The above described method forms nitride sidewall insulators 16a inside the trench 4. If oxide sidewalls are desired, the process may be modified as follows. An oxide layer may be formed by thermal oxidation to grow the oxide over the semiconductor wafer 10 and in the trench 4. This step forms oxide on the trench sidewalls and the trench bottom. However, this oxide will generally be too thick for the purpose of a thin gate oxide. The oxide over the bottom of the trench may be removed by an anisotropic etch. This etch leaves the oxide sidewalls 16a in place. The thin gate oxide 17 may then be formed over the bottom of the trench by steam oxidation such as $O_2$/HCL at about 900° C.

The inventive process advantageously complements a normal self-aligned MOS transistor flow wherein the source and drain regions are formed after creation of the gate and are self-aligned.

While this invention has been described with reference to illustrative embodiments, this description is not intended to be construed in a limiting sense. Various other embodiments of the invention will be apparent to persons skilled in the art upon reference to this description. For example, while the illustrative embodiment is with respect to an N-channel device, it is apparent that a P-channel device may be formed by using the appropriate type of semiconductor substrate and dopants. It is therefore contemplated that the appended claims will cover any such modifications of the embodiments as fall within the true scope and spirit of the invention.

What is claimed is:

1. A method of fabricating a transistor, comprising the steps of:
    forming a trench in a face of semiconductor material of a conductivity type, the trench having sidewalls and having a bottom with corners;
    forming a dielectric layer in the trench;
    forming a conductor layer in the trench;
    doping areas on sides of the trench to an opposite conductivity type; and
    driving the opposite doped areas on sides of the trench around the trench corners.

2. The method of claim 1 wherein the step of forming the dielectric layer in the trench comprises the steps of:
    forming a dielectric layer on the trench bottom;
    forming a dielectric layer on the trench sidewalls, the dielectric layer on the trench sidewalls having a width; and
    wherein the step of driving the opposite doped areas on sides of the trench around the trench corners includes driving below the trench bottom to about the width of the dielectric on the trench walls.

3. The method of claim 2 wherein the driving step is performed by annealing.

4. A method of fabricating a transistor, comprising the steps of:
    forming a trench in the surface of a semiconductor substrate, the trench having a bottom;
    forming a gate insulator layer in the trench;
    forming a gate conductor layer in the trench; and
    forming a transistor channel plane below the trench by providing source/drain diffusions in the surface of the semiconductor substrate that extend below the trench bottom and have a space between them.

5. The method of claim 4 wherein the source/drain diffusions have higher dopant concentrations above the transistor channel plane than below the transistor channel plane.

6. The method of claim 5 wherein the step of forming the transistor channel plane occurs by diffusing source/drain dopant material into the semiconductor substrate and annealing the dopant material so that it diffuses down into the substrate about as deep as the trench and around the trench bottom corners.

7. A method of making a self aligned recessed channel MOS transistor, comprising the steps of:
    forming a recess in a face of a semiconductor wafer, the recess having a bottom;
    forming sidewall insulators in the recess;
    forming a thin gate dielectric in the recess;
    forming a transistor gate in the recess between the sidewall insulators;
    forming transistor source and drain diffusions in the face of the semiconductor wafer on sides of the recess; and
    annealing the source and drain diffusions, the annealing causing the source and drain diffusions to out-diffuse around the bottom of the recess, thereby creating a transistor channel below the bottom of the recess, self aligned to the transistor gate within the trench.

8. The method of claim 7 wherein the step of annealing the source and drain diffusions provides a higher dopant concentration level near the semiconductor surface and a lower dopant concentration level around the bottom of the recess.

* * * * *